United States Patent [19]

Ishii et al.

[11] Patent Number: 5,801,527
[45] Date of Patent: Sep. 1, 1998

[54] APPARATUS AND METHOD FOR TESTING SEMICONDUCTOR DEVICE

[75] Inventors: Takao Ishii, Tokyo; Shuji Akiyama, Kofu; Hiroki Hosaka, Yamanashi-ken, all of Japan

[73] Assignee: Tokyo Electron Limited, Tokyo, Japan

[21] Appl. No.: 506,819

[22] Filed: Jul. 25, 1995

[30] Foreign Application Priority Data

Jul. 26, 1994 [JP] Japan ............................. 6-193691
Aug. 16, 1994 [JP] Japan ............................. 6-215314

[51] Int. Cl.⁶ ............................................. G01R 31/02
[52] U.S. Cl. ............................... 324/158.1; 324/754
[58] Field of Search ........................ 324/158.1, 754, 324/73.1, 758; 312/107, 107.5, 111

[56] References Cited

U.S. PATENT DOCUMENTS

| | | | |
|---|---|---|---|
| 4,844,565 | 7/1989 | Brafford et al. | 312/107.5 |
| 4,950,982 | 8/1990 | Obikane et al. | 324/754 |
| 5,086,270 | 2/1992 | Karasawa et al. | 324/754 |
| 5,151,651 | 9/1992 | Shibata . | |
| 5,192,908 | 3/1993 | Shibata . | |
| 5,196,993 | 3/1993 | Herron et al. | 312/107 |
| 5,278,494 | 1/1994 | Obigane | 324/754 |

FOREIGN PATENT DOCUMENTS 2-272470  11/1990  Japan .
4-76472   3/1992   Japan .

Primary Examiner—Ernest F. Karlsen
Attorney, Agent, or Firm—Oblon, Spivak, McClelland, Maier & Neustadt, P.C.

[57] ABSTRACT

A tester apparatus comprising a loader/unloader unit including a loader section for carrying a device, which have been carried to a carry-in section to a device-charging and -aligning section, and an unloader section for carrying device, which have been tested, from a device-discharging and -aligning section to a carry-out section, and a tester unit including carrier for carrying devices, which have been aligned at the device-charging and -aligning section, to a test position while carrying device, which have been tested, from the test position to a device-discharging and -aligning section, and a test section for electrically testing device at the test position to find whether the device is good or fault ones, wherein the tester unit is detachably connected to the loader/unloader unit.

15 Claims, 14 Drawing Sheets

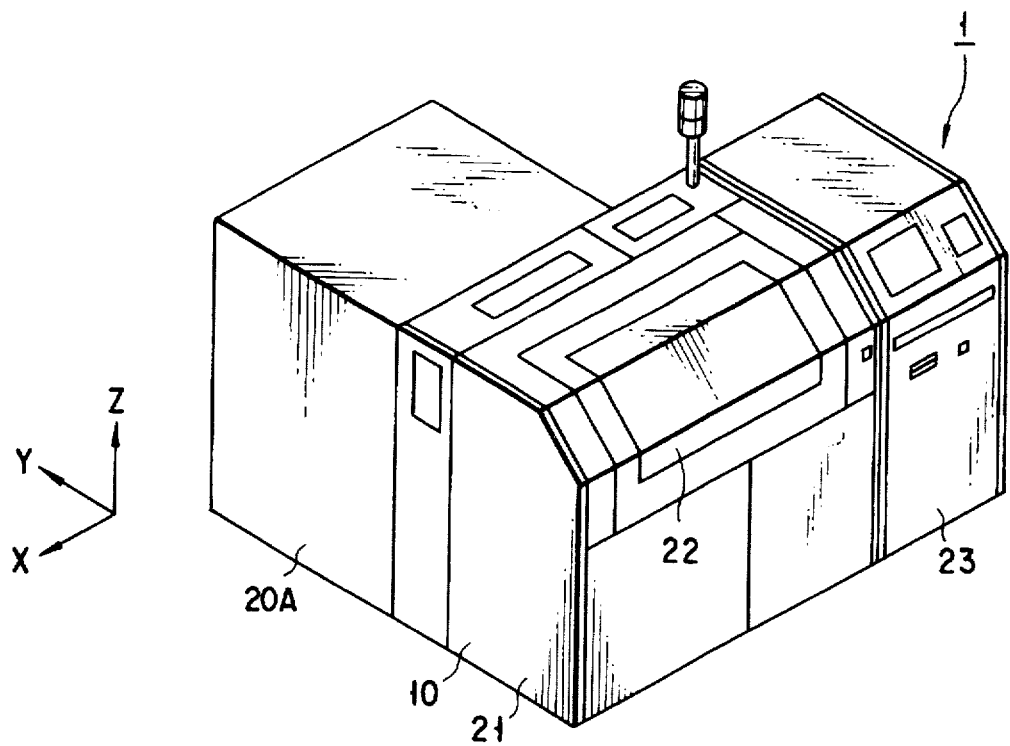
F I G. 2

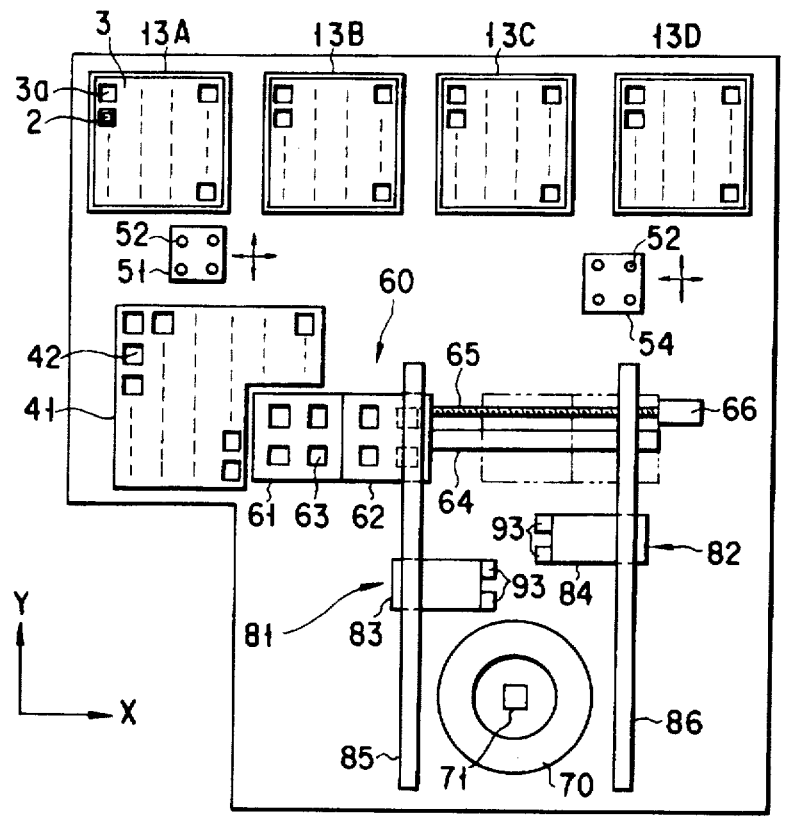
F I G. 4
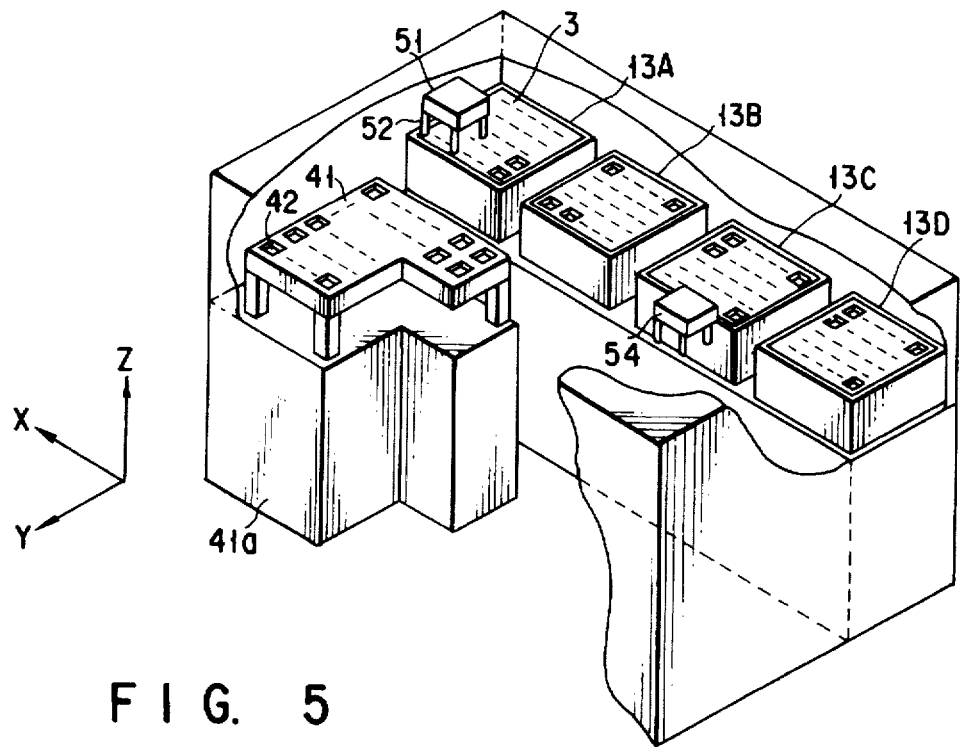
F I G. 5

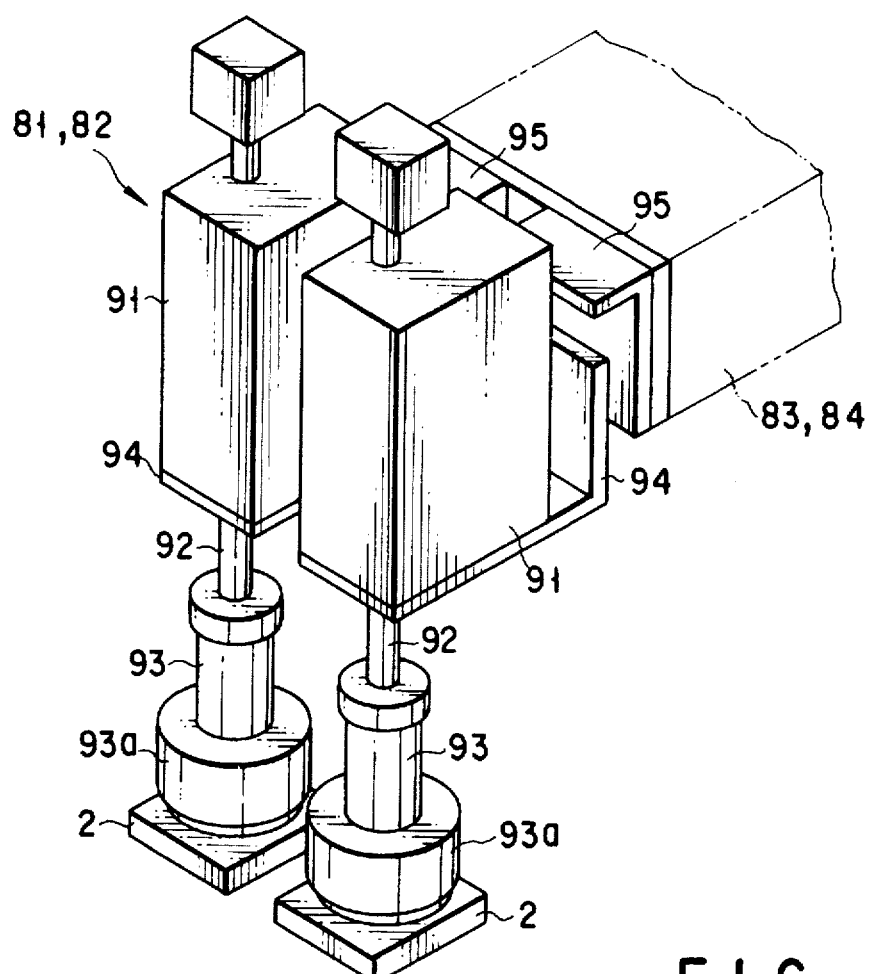
F I G. 6
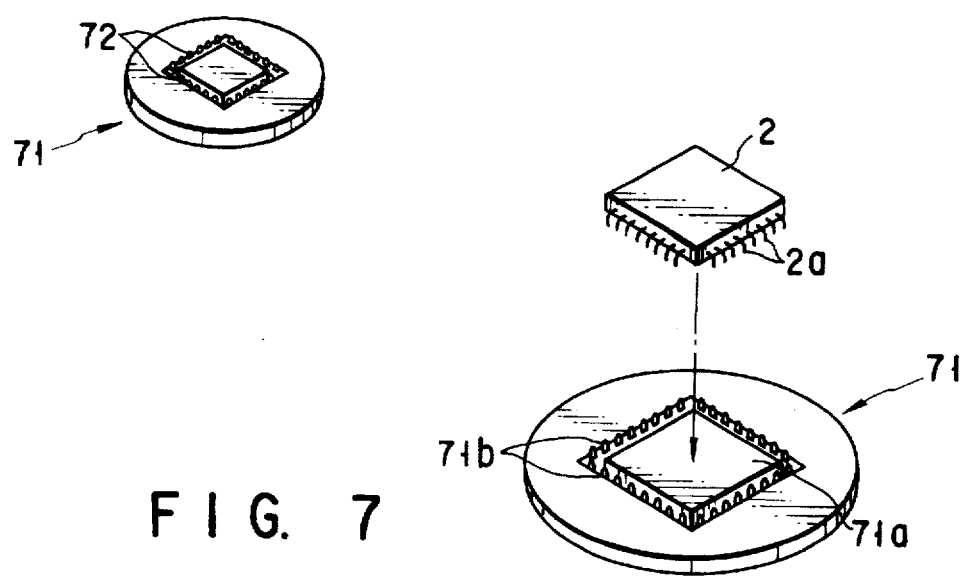
F I G. 7

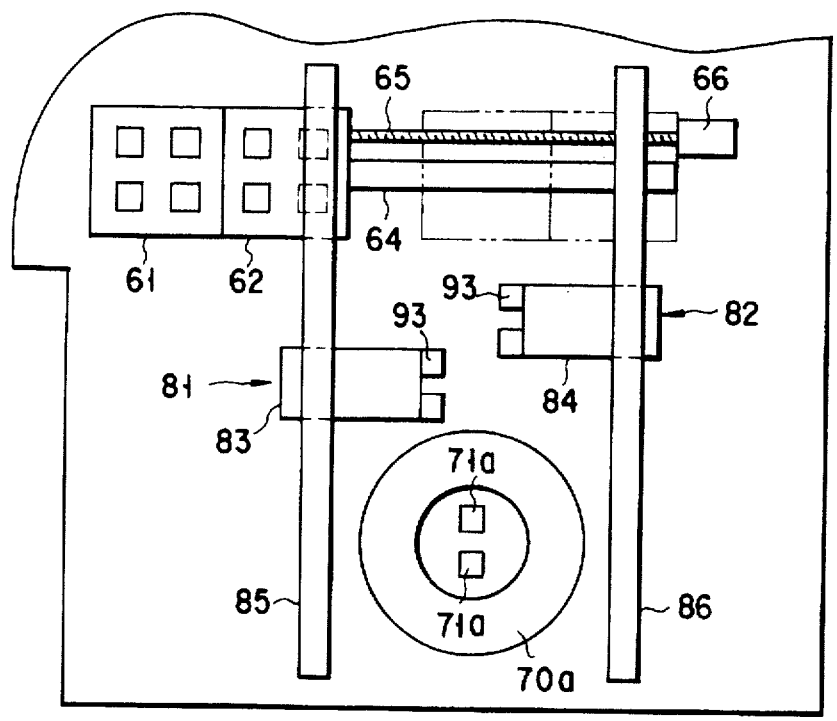
F I G. 14
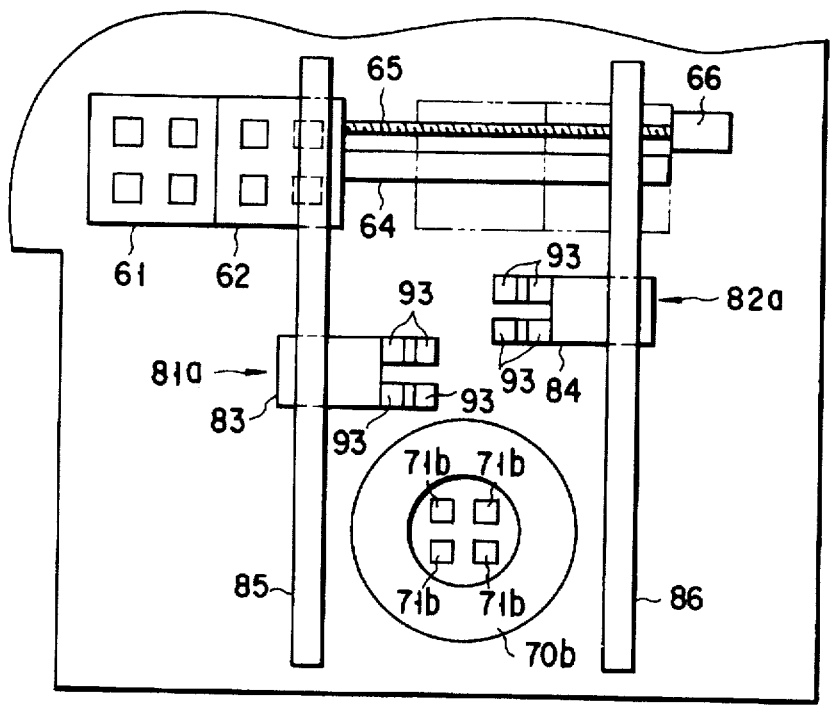
F I G. 15

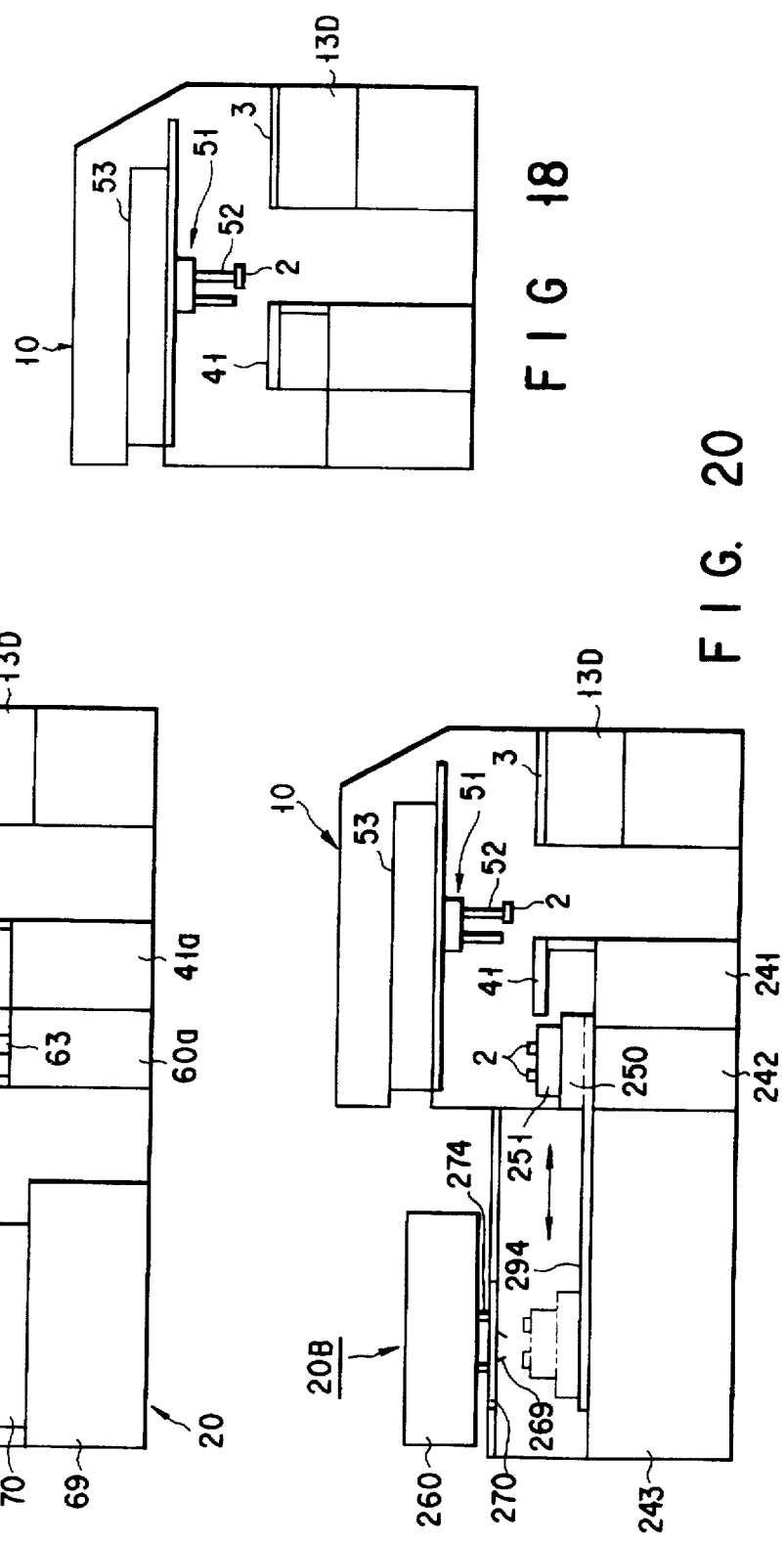

APPARATUS AND METHOD FOR TESTING SEMICONDUCTOR DEVICE

BACKGROUND OF THE INVENTION

1. Field of the Invention

The present invention relates to an apparatus for testing semiconductor device.

2. Description of the Related Art

The packaged semiconductor device is tested of the electric characteristic. As the tester apparatus of this kind, a system which is a combination of the tester for testing the electric characteristic of the device, and the device-handling unit has been used. As memory capacity becomes larger and larger, various improvements have been tried to shorten the test time, increase the number of devices parallel-tested, and make the efficiency of device-carrying sequence higher.

A well-known device-testing system is intended to put lead terminals (or pins) of a device into a socket and electrically connect the device to a test head, which is arranged under the socket, through electrodes in the socket. However, the device has become smaller in size, the pitch of its lead terminals has become narrower, and its number tested has become larger. In addition, the logic IC has had more functions and the number of lead terminals has become larger accordingly. The system of the socket type cannot meet these needs and a system of the probe card type has been employed.

One of the conventional tester apparatuses disclosed in Jpn. Pat. Appln. KOKAI Publication No. Hei 4-76472 is shown in FIG. 1. It includes a carry-in section 4, an empty-tray-mounted section 5, a carry-out section 6 and a test section 7. Plural semiconductor devices are carried from outside to the carry-in section and they are successively picked up from a tray 3 and carried to the test section 7 where the electric characteristic of each device is tested. On the other hand, the tray 3 is carried from the carry-in section to the empty-tray-mounted section 5 and then to the carry-out section 6 by a robot arm (not shown). Tables (not shown) on which good and fault devices are placed independently of the other are provided at the carry-out section 6, and tested devices are assorted to the good- and fault-device-placed tables, respectively.

The tester apparatus is a large-sized and precise system including tray-placed tables, carry-in and -out sections, carrier mechanisms and a tester unit. In addition, both of units for testing devices with probes (or needle contact) and with sockets must be prepared depending upon kinds of devices tested. In the mass production of devices, however, many tester apparatuses are used to gain a high throughput. When two kinds of unit are needed per a tester apparatus, therefore, cost becomes high and a large space is needed.

Further, time (or index time) needed to carry in, test and carry out devices must be shortened to keep the throughput high. Conventionally, therefore, it is arranged that the carrier mechanism has plural suction-holding sections to suck plural devices at the same time and that the devices thus held are then tested one by one.

In the conventional apparatus, however, devices held by other suction-holding sections cannot be replaced by next ones when a device is being tested while causing its suction-holding section to put it into the socket section. After all of devices held are tested, therefore, the suction-holding sections must be moved to a device-receiving and -aligning section and then to a device-supplying and -aligning section. The index time cannot be shortened enough, accordingly, thereby preventing the throughput from being kept high.

Even if plural carrier mechanisms which can move independently of the others are provided, it must be arranged that they can freely move among the device-supplying and -aligning section, the socket section and the device-receiving and -aligning section. The whole of the carrier mechanisms becomes extremely large in size in this case because the area where a carrier mechanism is moved, for example, must not positionally interfere with mechanism components such as a guide section for another carrier mechanism.

SUMMARY OF THE INVENTION

An object of the present invention is therefore to provide a tester apparatus capable of testing semiconductor devices at a higher efficiency, in a smaller space and at a lower cost.

Another object of the present invention is to provide apparatus and method capable of testing semiconductor devices at a higher throughput.

According to an aspect of the present invention, there can be provided a tester apparatus for carrying a semiconductor device from a carry-in section to a test position via a device-charging and -aligning section, electrically testing the device at the test position and then carrying the device to a carry-out section via a device-discharging and -aligning section, the tester apparatus comprising; a loader/unloader unit including a loader section for carrying device, which have been carried to the carry-in section, to the device-charging and -aligning section, and an unloader section for carrying device, which have been tested, from the device-discharging and -aligning section to the carry-out section; and a tester unit including carrier means for carrying devices, which have been aligned by the device-charging and -aligning section, to the test position and carrying them from the test position to the device- discharging and -aligning section, and a test section for electrically testing the device at the test position to find whether the device is are good or fault ones; wherein the tester unit is detachably connected to the loader/unloader unit.

Depending upon kinds of semiconductor device tested, a tester unit which is suitable for the devices tested is connected to the loader/unloader unit. When lead terminals of each semiconductor device have a wide arrangement pitch (of about 0.65 mm, for example), a first tester unit is used. When they have a narrow arrangement pitch (of about 0.3 mm, for example), however, a second tester unit is used.

According to another aspect of the present invention, there can be provided a tester apparatus for testing a semiconductor device having lead terminals, comprising an alignment section movable from an end of a moving area thereof to another end thereof along X axis and serving to position the device; a loader for transferring the device, which is to be tested, onto the alignment section at one end of the moving area; an unloader for receiving the device, which have been tested, from the alignment section at the other end of the moving area; a test section located remote from the moving area of the alignment section in a direction of Y axis to apply continuity test to the device while electrically contacting the lead terminals; a first carrier mechanism movable in each of directions of X axis, Y axis and Z axis and for holding the device at the alignment section and carrying the device to the test section and then carrying devices, which have been tested, from the test section to the alignment section; and a second carrier mechanism movable in each of directions of X axis, Y axis and Z axis and for holding the device at the alignment section and carrying the device to the test section and then carrying devices, which have been tested, from the test section to the alignment section; wherein the first and second carrier mechanisms transfer and receive the device to and from the alignment section between the one end and the other end of the moving area of the alignment section.

According to a further aspect of the present invention, there can be provided a method of testing a semiconductor device, comprising the steps of, preparing a first tester unit, a second tester unit and a loader/unloader unit provided with a carry-in section, an alignment section and a carry-out section; connecting the first tester unit to the loader/unloader unit; carrying a first device into the carry-in section of the loader/unloader unit; carrying the first device from the carry-in section to the first tester unit via the alignment section; testing the first device in the first tester unit; carrying the first device, which has been tested, to the carry-out section through the alignment section of the loader/unloader unit; carrying the tested first device from the carry-out section; detaching the first tester unit from the loader/unloader unit; connecting the second tester unit to the loader/unloader unit; carrying a second device into the carry-in section of the loader/unloader unit; carrying the second device from the carry-in section to the second tester unit through the alignment section; testing the second device in the second tester unit; carrying the second device, which has been tested, to the carry-out section through the alignment section of the loader/unloader unit; and carrying the tested second device from the carry-out section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a perspective view showing a tester apparatus according to an embodiment of the present invention;

FIG. 4 is a plan view showing the inside of the tester apparatus which is a combination of the loader/unloader unit and the first testing unit;

FIG. 5 is a perspective view showing the inside of the loader/unloader unit;

FIG. 6 is a perspective view showing a suction-holding section of a carrier mechanism;

FIG. 7 is a perspective view schematically showing a socket section;

FIG. 14 is a plan view showing the inside of the tester apparatus according to another embodiment of the present invention;

FIG. 15 is a plan view showing the inside of the tester apparatus according to a further embodiment of the present invention;

FIG. 18 is a perspective view showing the loader/unloader unit detached;

FIG. 19 is a perspective view showing the loader/unloader unit connected to the first testing unit; and FIG. 20 is a perspective view showing the loader/unloader unit connected to the second testing unit.

DETAILED DESCRIPTION OF THE PREFERRED EMBODIMENTS

Figure 1:
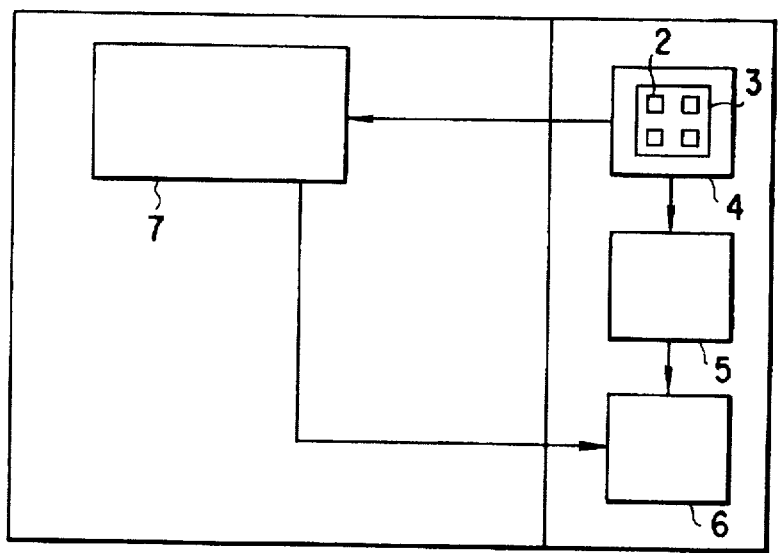
FIG. 1 is a plan view showing a conventional tester apparatus.

Various kinds of embodiment according to the present invention will be described with reference to the accompanying drawings.

As shown in FIG. 2, a tester apparatus 1 are covered by armor plates 21 and it includes a loader/unloader unit 10, a first testing unit 20A and an operation unit 23. A door 22 is arranged at the front side of the loader/unloader unit 10 through which a tray 3 is carried into and out of the unit 10. The operation unit 23 is located next to the loader/unloader unit 10 and it is intended to operate the loader/unloader unit 10 and the first testing unit 20A. The operation unit 23 has a total weight of about 170 kg. The loader/unloader unit 10 is intended to carry devices 2, each of which is a packaged semiconductor chip, into and out of the tester apparatus 1 and it has a total weight of about 400 kg.

The first testing unit 20A includes a tester (not shown) of such a type that electrically checks a semiconductor device of the mold type while putting it into a socket section. The unit 20A has a total weight of about 500 kg. A second testing unit 20B shown in FIG. 20 can be used instead of the first one 20A. It includes a tester of such a type that electrically checks a semiconductor device of the flat package type while keeping probes contacted with lead terminals of each of the devices mounted on a device-mounted table. The unit 20B has a total weight of about 800 kg. These units 10, 20A and 20B are made independently of the others and they are connected and disconnected according to circumstances.

Figure 3:
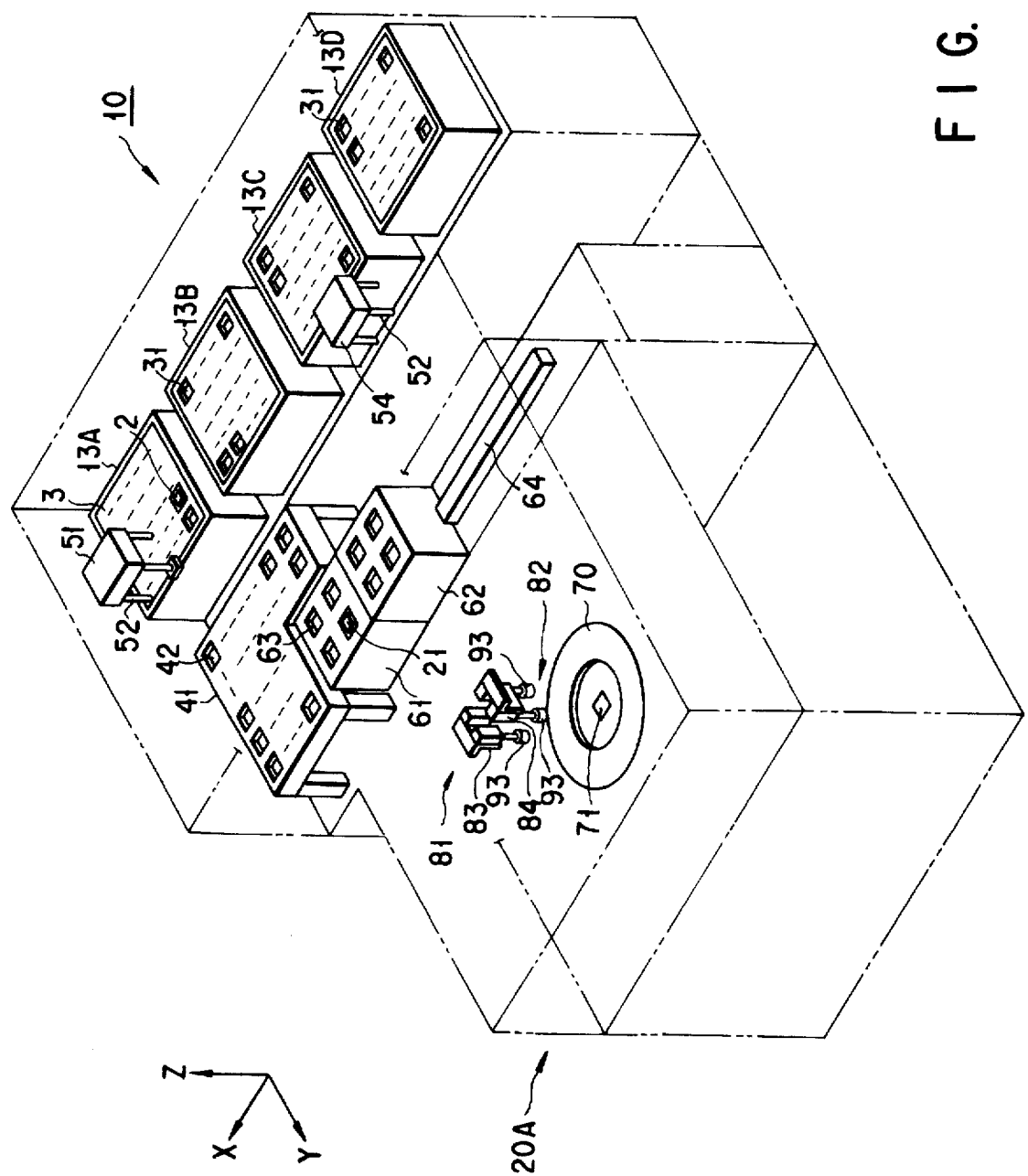
FIG. 3 is a perspective view showing the inside of the tester apparatus which is a combination of a loader/unloader unit and a first testing unit.

As shown in FIG. 3, the loader/unloader unit 10 has four tray-mounted sections 13A, 13B, 13C and 13D which are arranged adjacent to the door 22 and side by side in the direction of an axis X. When the door 22 is opened, they can be seen by eyes. Trays 3 on each of which devices to be tested are placed are mounted on first and second tray-mounted sections 13A and 13B while empty trays 3 on each of which devices already tested are to be placed are mounted on third and fourth tray-mounted sections 13C and 13D.

Plural trays 3 are mounted on each of the tray-mounted sections 13A–13D and plural devices 2 are placed on each of the trays 3. A plurality of reversed trapezoidal recesses 31 each having tilted sides are formed in each of the trays 3. When the device 2 is put into each of the recesses 31, it slides into the recess 31 along tilted sides thereof and it is thus kept horizontal in the recess 31.

Further, the loader/unloader unit 10 has a pre-heating plate 41. This pre-heating plate 41 is located behind the first and second tray-mounted sections 13A and 13B. The pre-heating plate 41 has a plurality of device-holding recesses 42 aligned in columns and lines and it houses a heating source therein to pre-heat the devices 2 up to 150° C., for example.

Furthermore, the loader/unloader unit 10 has a loader section 51. This loader section 51 is a carrier means for supplying the devices 2 from the pre-heating plate 41 to a device-charging and -aligning section 61, and it has four suction-holding sections 52.

As shown in FIGS. 18 through 20, each suction-holding section 52 can be moved in directions of X, Y and Z axes by a drive section 53 on the ceiling of the loader/unloader unit 10. An other frame to which drive sections 53 for loader and unloader sections 51 and 54 are attached is different and independent from the frame to which drive sections 80 for carrier means 81 and 82 are attached. A base 41a for holding the pre-heating plate 41 is also different and independent from a base 60a for holding the aligning section 60. A frame of the loader/unloader unit 10 is also different and independent from a frame of the tester unit 20A.

As shown in FIG. 5, the loader/unloader unit 10 is detachable formed such as an independent casing and it can be connected to and disconnected from the first testing unit 20A. The unloader section 54 is arranged on a carry-out side of the loader/unloader unit 10 (or at an area of the unit 10 where the third and fourth tray-mounted tables 13C and 13D are located). The unloader section 54 has same arrangement as that of the loader section 51.

Device-charging and -discharging alignment sections 61 and 62 are arranged side by side along the axis X i the first tester unit 20A. These sections 61 and 62 are located adjacent to the pre-heating plate 41. Recesses 63 are formed in each of them, having a certain interval between them, to thereby align four devices 2 in it. These recesses 63 are substantially same as the above-mentioned ones 31 and 42.

As shown in FIGS. 4 and 5, a corner of the pre-heating plate 41 is cut away and one end of a rail 64 extends into the cut-away portion (or first position) of the pre-heating plate 41. The rail 64 runs along the axis X, crossing an area (or second position) of the unit 10 which spreads along the front of the tester unit 20A. A screw belt 65 is arranged parallel to the X-axis rail 64 and one end of the screw belt 65 is connected to a motor 66 while the other end thereof to the assembly 60 of alignment sections. When the screw belt 65 is driven by the motor 66, the assembly 60 which includes alignment sections 61 and 62 is moved along the rail 64. Devices 2 are loaded on the assembly 60 at the first position and devices 2 are transferred from the assembly 60 to the tester unit 20A at the second position.

A socket section 71 is arranged in the first tester unit 20A. It is held by a ring holder 70. A device 2 is tested at it in this case. A pair of carrier mechanisms 81 and 82 are arranged to move from the second position to just above the socket section 71 along the axis Y. They have device-holding and -carrying units 83 and 84. The unit 83 runs on a Y-axis rail 85 while the other unit 84 runs on another Y-axis rail 86. These units 83, 84 are arranged to face each other but not to interfere with each other.

As shown in FIG. 6, each of the device-holding units 83 and 84 has two suction-holding sections 93. Each suction-holding section 93 is attached to the carrier means 83 or 84 through a bracket 95 and a support plate 94. Each of sections 93 has an air cylinder 91 for moving a shaft 92 up and down. A vacuum attracting disk 93a is attached to the lower end of the shaft 92 to attract the device 2.

As shown in FIG. 7, the socket section 71 has a section 71a on which the semiconductor device 2 of the mold type is mounted. A groove 72 is formed enclosing the device-mounted section 71a and a plurality of electrodes 71b are attached to outer sides of the groove 72. These electrodes 71b are arranged to correspond to their respective lead terminals 2a of the device 2 and they are electrically connected to a circuit of a test head 70. When the device 2 is pushed against the device-mounted section 71a, the lead terminals 2a are fitted into the groove 72 to surely contact the electrodes 71b. The test head 70 houses an insert ring, which includes a θ-rotation correcting mechanism (not shown) to correct a rotation shift of the device 2.

Referring to FIGS. 8 through 12, it will be described how the loader/unloader and tester units are connected to each other. Although the first testing unit 20A is connected to the loader/unloader unit 10 in this case, the second testing unit 20B may be connected to the loader/unloader unit 10 through same connecting assemblies.

Figure 8:
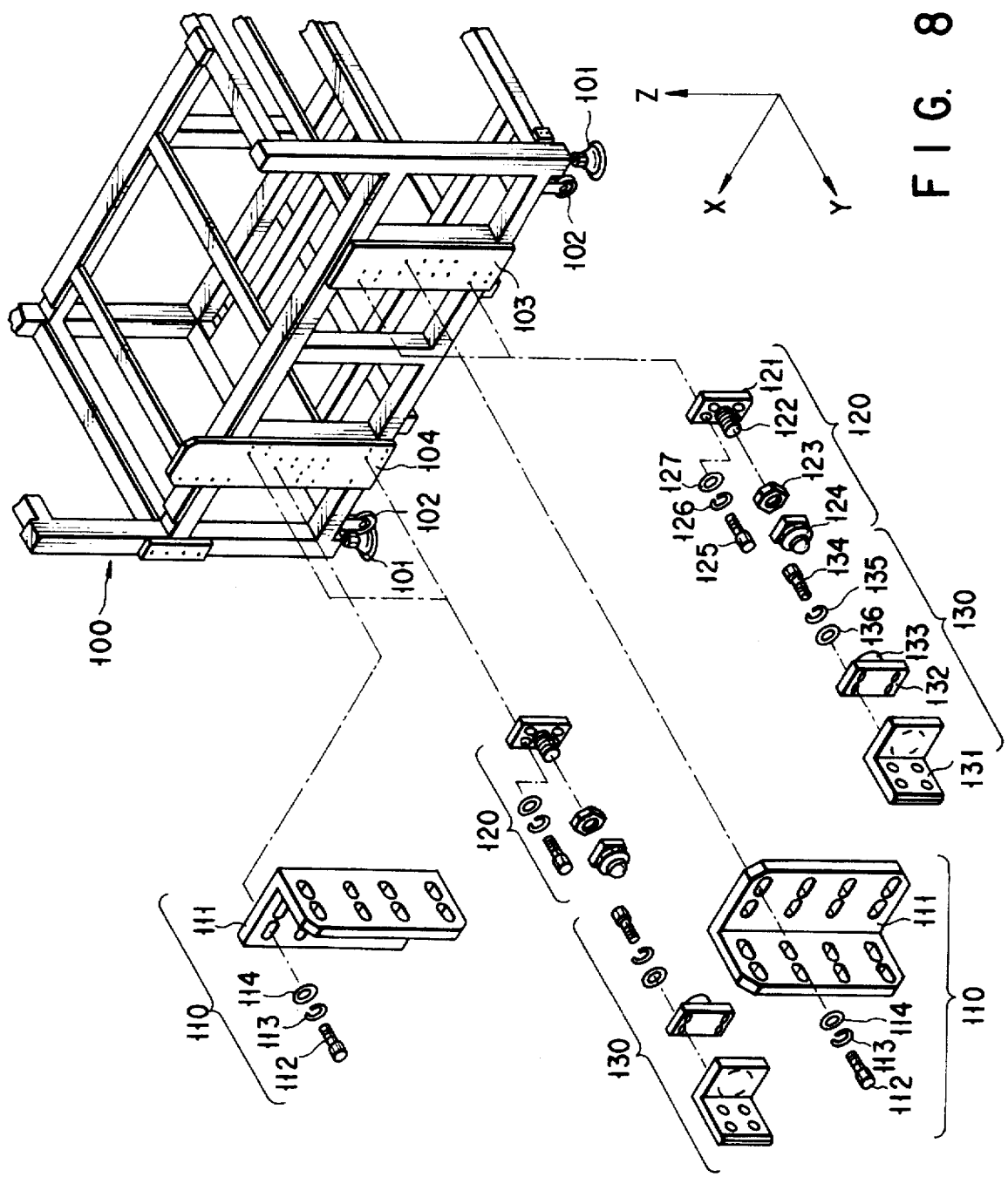
FIG. 8 is a perspective view showing unit-connecting assemblies dismantled.

As shown in FIG. 8, a frame 100 is formed a part of the casing of the loader/unloader unit 10. A plurality of legs 101 and casters 102 are attached to each of lower corners of the frame 100 to enable the frame 100 (or unit 10) to be carried on the floor and to be adjusted in height. Attaching plates 103 and 104 are fixed to a side of the frame 100 (or rear side of the loader/unloader unit 10). They are long the in Z-axis direction and separated from each other at a certain interval. They are same in width but the one 104 is a little longer than the other 103. Their lower ends are set at a same level but their upper ends at different levels.

Figure 9:
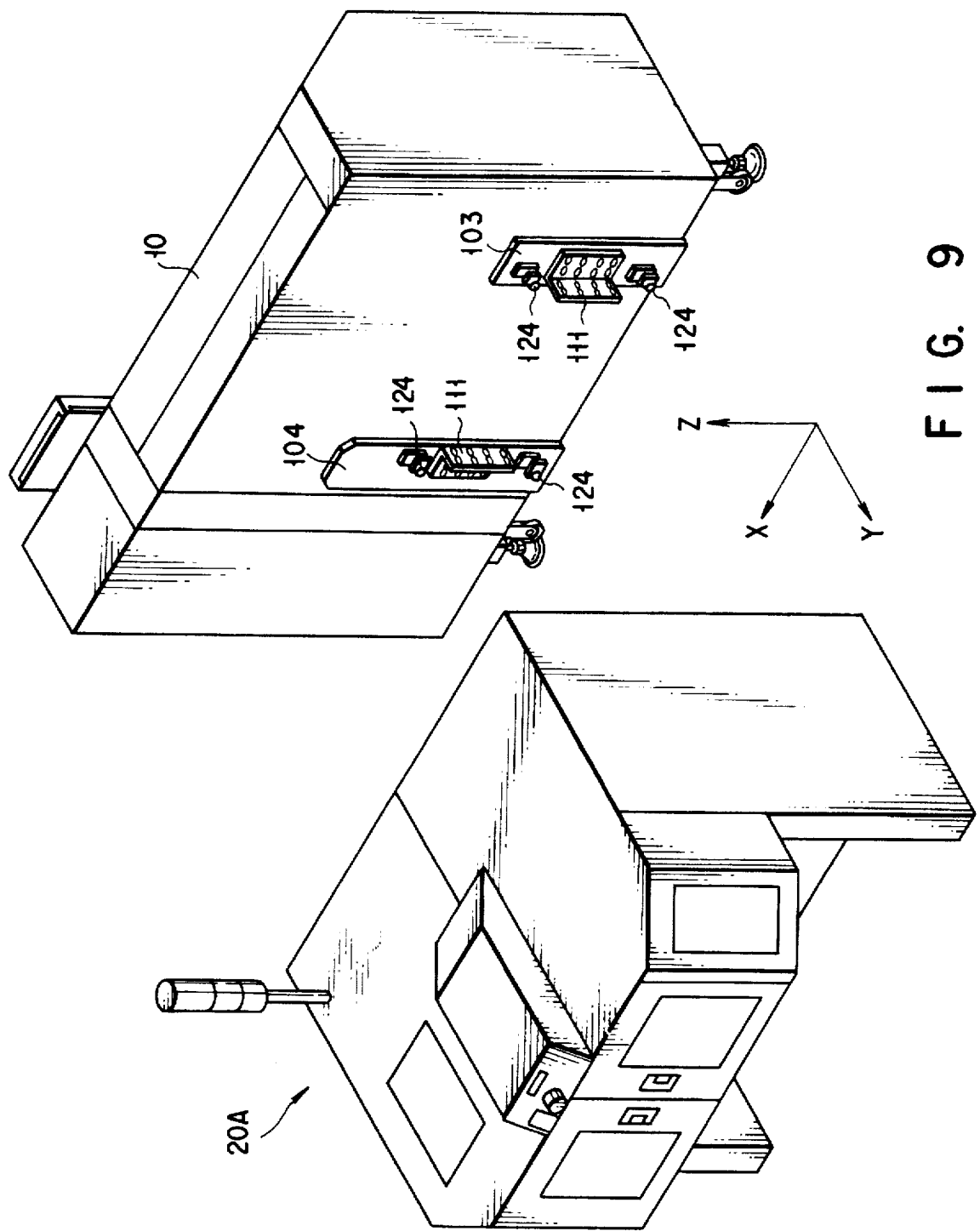
FIG. 9 is a perspective view showing that face of a unit to which unit-connecting assemblies are attached.

As shown in FIG. 9, joint and positioning assemblies 110 and 120 are attached to each of the attaching plates 103 and 104. The joint assembly 110 is used to connect the units 10 and 20A to each other and it includes an angle 111 fixed to the attaching plate 103 or 104 through a screw 112 and washers 113, 114. Plural slots are formed in the angle 111 to position the units 10 and 20A to each other.

The positioning assembly 120 includes a level plate 121, a bolt 122, adjusting and convex nuts 123 and 124. The adjusting nut 123 serves to adjust the screwed position (or position in the Y-axis direction) of the convex nut 124. The level adjusting plate 121 is fixed to the attaching plate 103 or 104 through a screw 125 and washers 126, 127. A slot is formed in the level adjusting plate 121 to enable the convex nut 124 to be adjusted at level.

On the other hand, positioning assemblies 130 are also attached to the rear side of the tester unit 20A. Each positioning assembly 130 includes a level adjusting angle 131, a horizontally adjusting plate 132 and a concave block 133. The level adjusting angle 131 is fixed to a frame (not shown) of the tester unit 20A through a screw 134 and washers 135, 136. A slot is formed in the level adjusting angle 131 to enable the concave block 133 to be adjusted at level. A slot is also formed in the horizontally adjusting plate 132 to enable the concave block 133 to be adjusted of its horizontal position (or position in the X-axis direction). A concave or recess 133a is formed in the concave block 133.

Figure 10:
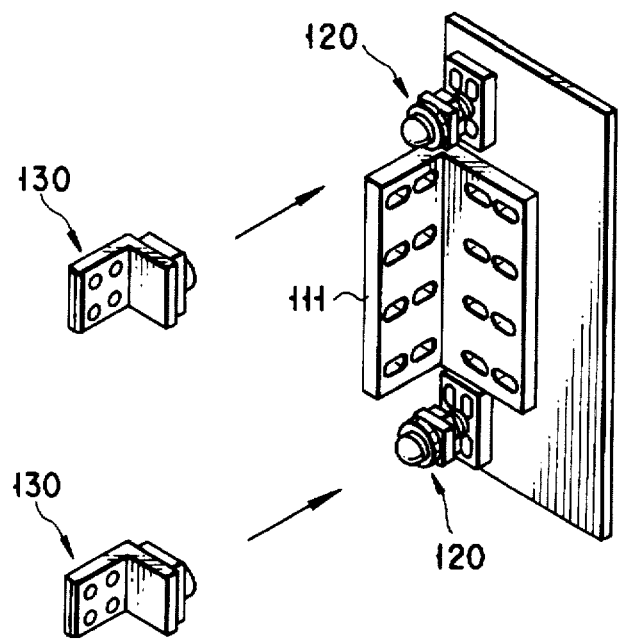
FIG. 10 is a perspective view showing main portions of the unit-connecting assemblies dismantled.
Figure 11:
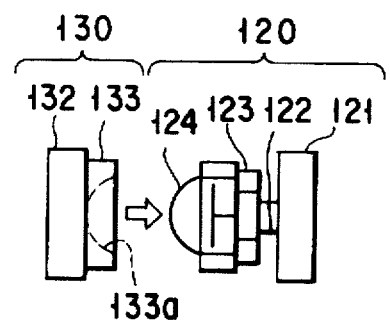
FIG. 11 is a side view showing a main portion of the unit-connecting assembly before a unit is connected.
Figure 12:
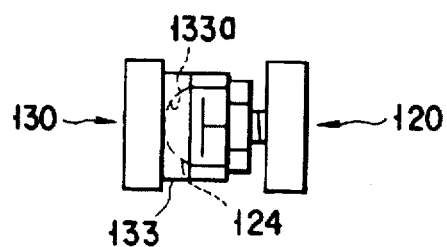
FIG. 12 is a side view showing the main portion of the unit-connecting assembly after the unit is connected.

As shown in FIGS. 10 and 11, the second positioning assembly 130 is position-adjusted to correspond to its respective first positioning assembly 120. When the convex nut 124 is fitted into the concave 133a of the concave block 133, as shown in FIG. 12, the tester unit 20A is positioned relative to the loader/unloader unit 10. After this positioning finished in this manner, the screw 112 is screwed and when the angle 111 is fixed to the attaching plate 103 or 104, both of the units 10 and 20A are connected to each other.

Referring to FIGS. 13A through 13H, it will be described how the above-described apparatus is operated.

Trays 3 on which devices 2 of the mold type are placed are carried onto the tray-mounted sections 13A and 13B. Four devices A–D are sucked and held at the same time and carried onto the pre-heating plate 41 by the loader section 51. They are heated up to a pre-determined temperature by the pre-heating plate 41. They are then carried to the first position by the loader section 51. They are then transferred, at the same time, onto the device-supplying and -aligning section 61 which is waiting at the first position. While they are being pre-heated by the pre-heating plate 41, their next four devices E–H are carried from the tray 3 to the pre-heating plate 41 by the loader 51.

Figure 13A:
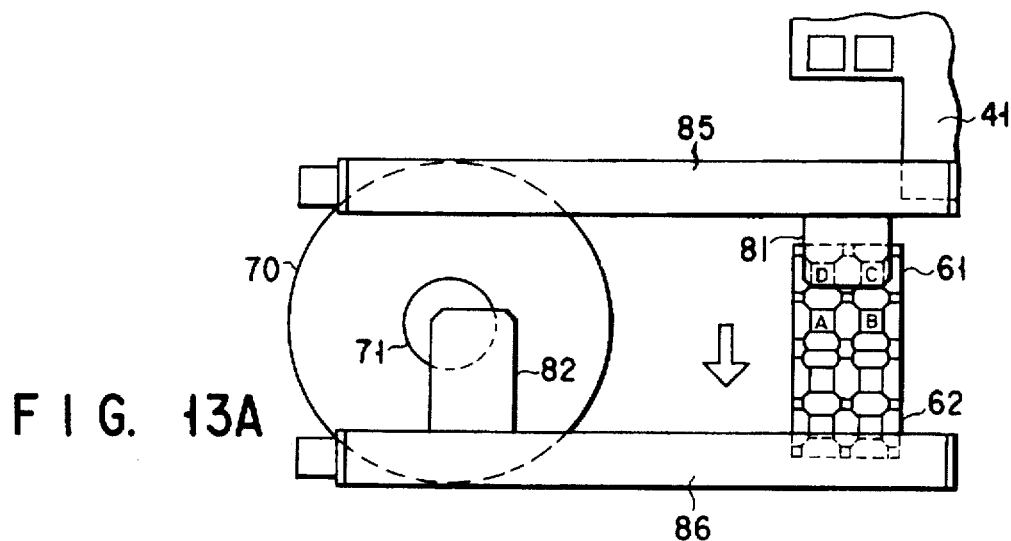
FIGS. 13A through 13H are plan views showing how first and second carrier mechanisms are made operative at an alignment section.
Figure 13B:
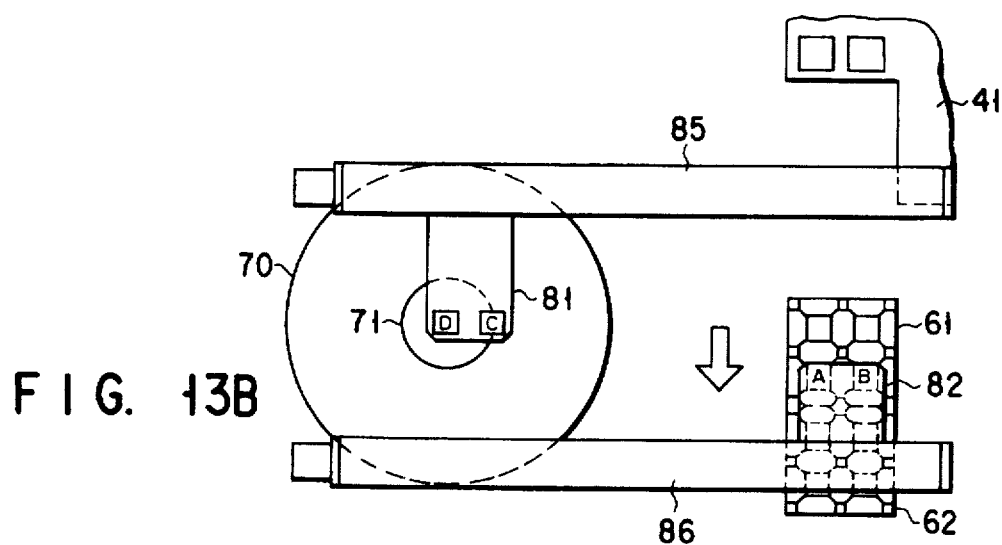

As shown in FIG. 13A, the supply and alignment section 61 is moved to the second position and two devices C and D are picked up by the suction-holding section 93 of the first carrier mechanism 81. The supply and alignment section 61 is then moved in the X-axis direction only by one pitch stroke, as shown in FIG. 13B. The one pitch stroke is about 60 mm. The first carrier mechanism 81 is moved just above the socket section 71 while the second carrier mechanism 82 is moved to the second position (or just above the supply and alignment section 61). The device D is tested at first. While the device D is being tested, two devices A and B are picked up by the suction-holding section 93 of the second carrier mechanism 82. The device C is then tested.

Figure 13C:
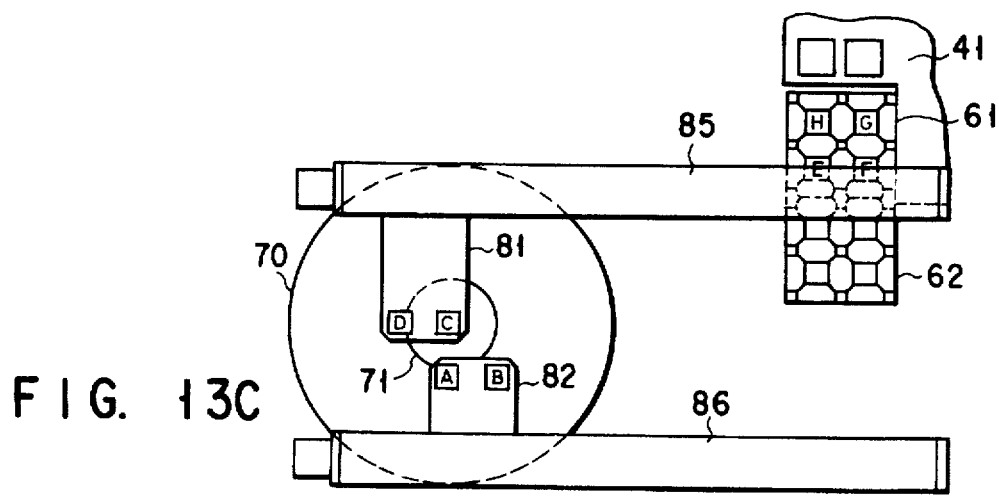
Figure 13D:
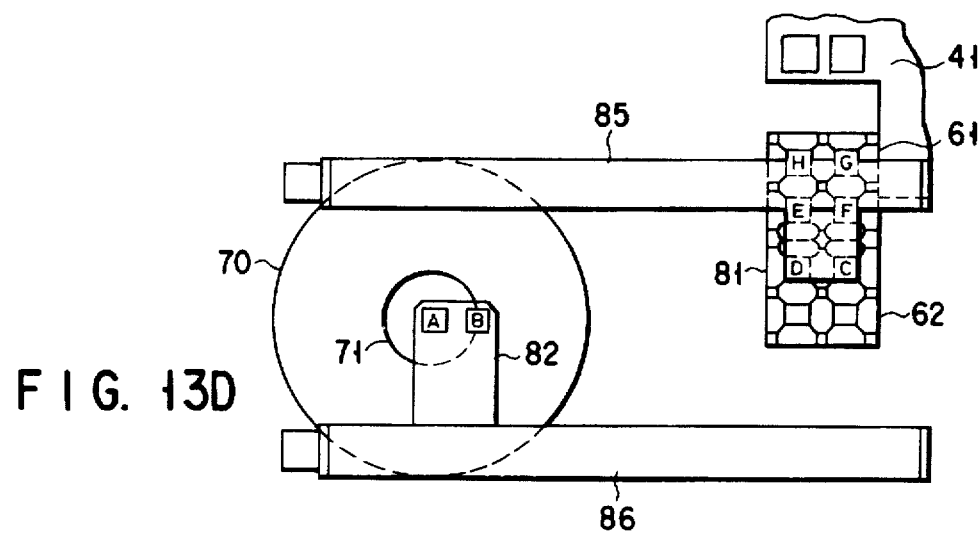

During the testing of the device C, the second carrier mechanism 82 is moved above the socket section 71 while the supply and alignment section 61 is returned to the first position, as shown in FIG. 13C. The second carrier mechanism 82 is retreated in the X-axis direction this time not to interfere with the first carrier mechanism 81. The next four devices E–H are transferred onto the supply and alignment section 61 at the same time. During the testing of the device A, devices C and D (which have been tested) are transferred onto the device-housing and -aligning section 62 by the first carrier mechanism 81, as shown in FIG. 13D. Following the device A, the device B is then tested.

Figure 13E:
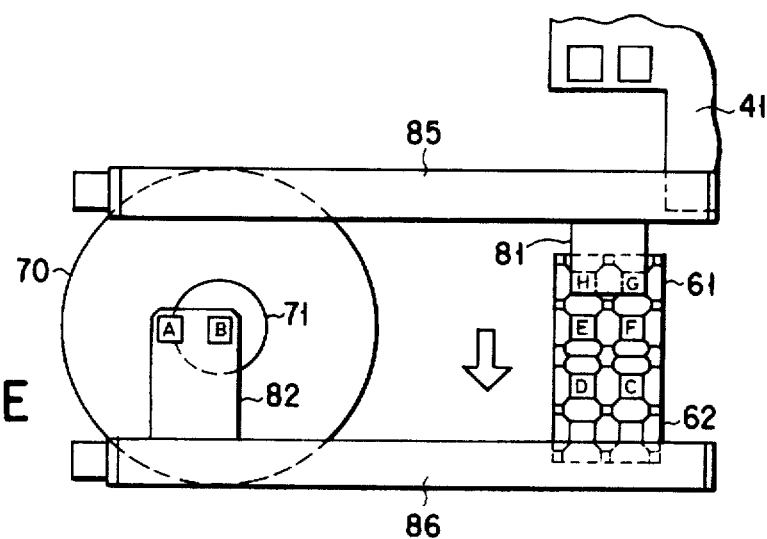
Figure 13F:
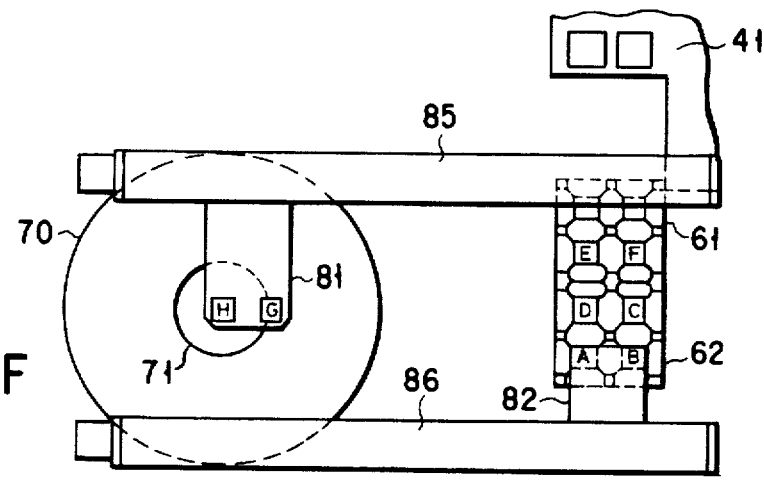

During the testing of the device B, two devices G and H are picked up from the supply and alignment section 61 and carried to the socket section 71 by the first carrier mechanism 81, as shown in FIG. 13E. During the testing of the device H, devices A and B (which have been tested) are transferred onto the device-housing and -aligning section 62, as shown in FIG. 13F.

Figure 13G:
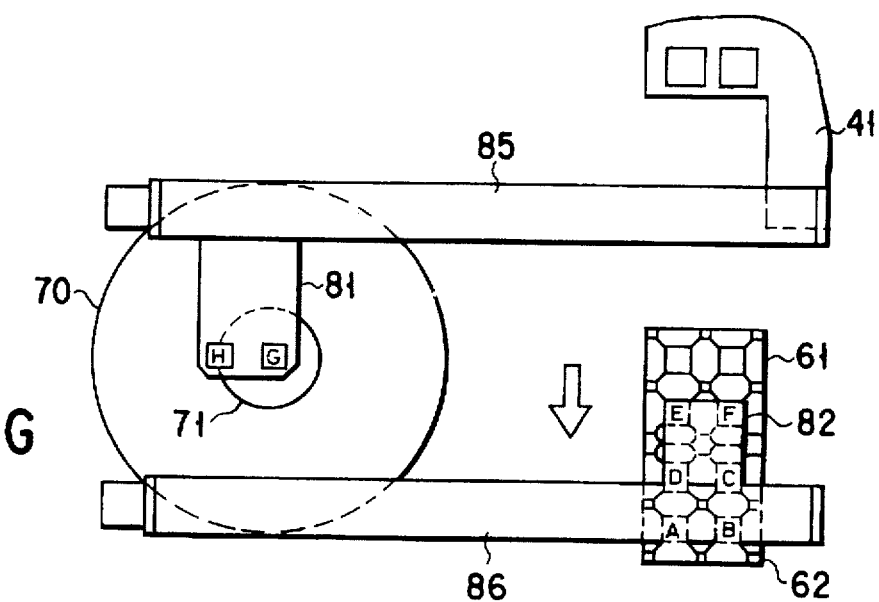
Figure 13H:
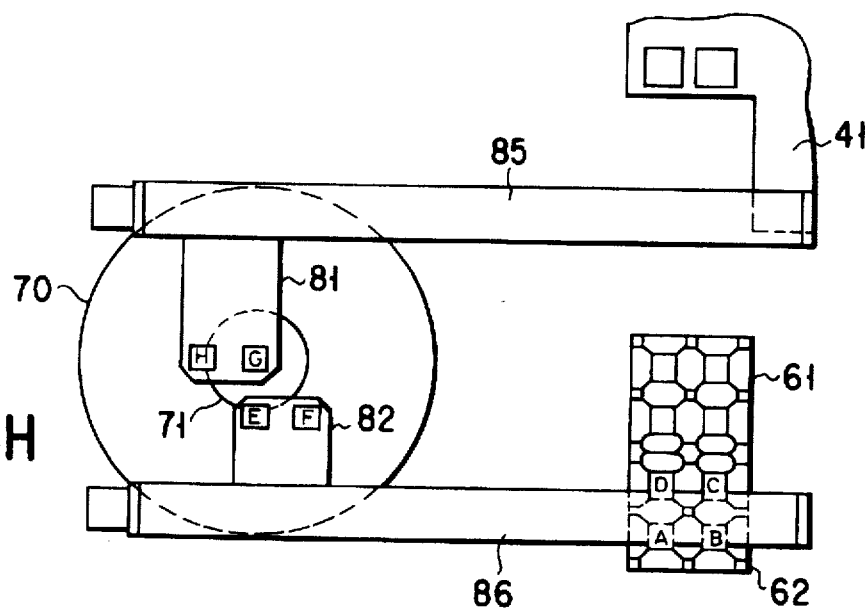

During the testing of the device G, the supply and alignment section 61 is moved in the X-axis direction only by one pitch stroke, as shown in FIG. 13G. Two devices E and F are picked up by the second carrier mechanism 82. While devices E and F are being carried above the socket section 71, the device-housing and -aligning section 62 is moved in the X-axis direction only by one pitch stroke, as shown in FIG. 13H. The second carrier mechanism 82 is retreated in the X-axis direction this time not to interfere with the first carrier mechanism 81. Devices A–D are picked up from the section 62 and carried to the tray 3 on one of the tray-mounted sections 13C and 13D by the unloader 54. Devices A–D which have been tested are assorted to good and fault ones and then carried.

According to the above-described apparatus, testing time (or test cycle) per device can be shortened from 8 seconds in conventional cases to 1.5 seconds.

Further, the device-supplying and -housing alignment sections 61 and 62 are moved in the X-axis direction. Therefore, the stroke of each of the carrier mechanisms 81 and 82 moved in the X-axis direction can be made smaller. This enables their drive sections 80 to be made by far smaller in size.

Figure 16:
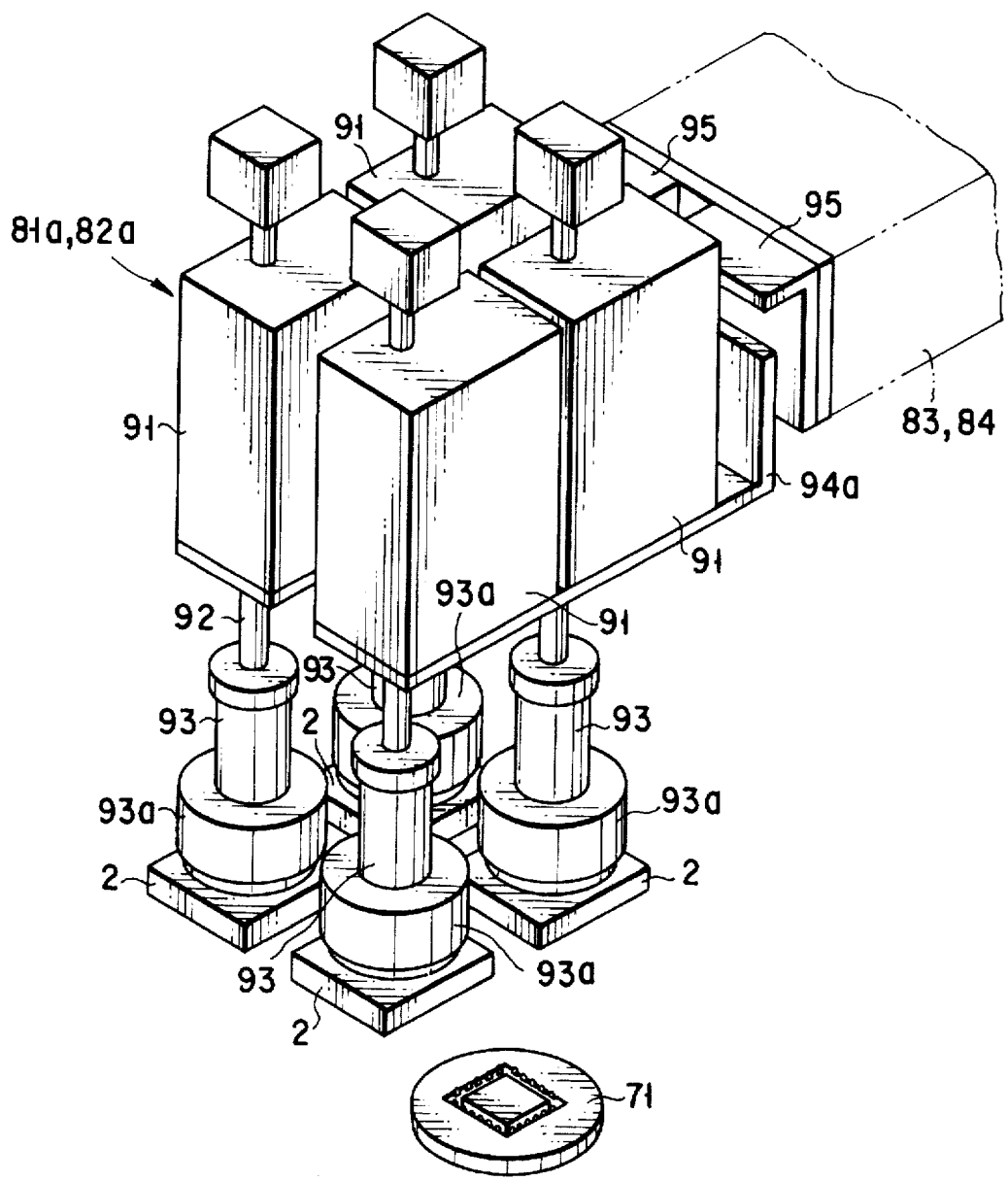
FIG. 16 is a perspective view showing a suction-holding section of the carrier mechanism according to a still further embodiment of the present invention.

FIGS. 14 through 16 show variations of the tester apparatus. As shown in FIG. 14, a socket section 70a having two device-mounted sections 71a may be used. As shown in FIG. 15, a socket section 70b having four device-mounted sections 71b can also be used. In the case of this socket section 70b, carrier mechanisms 81a and 82a each having four suction-holding sections 93 are used, as shown in FIG. 16. When the number of device-mounted sections at the socket section is increased along with the number of the suction-holding sections of each of the carrier mechanism in this manner, the test can be realized with a higher throughput.

Referring to FIGS. 17 through 20, a case where the second tester unit 20B is connected to the loader/unloader unit 10 will be described.

In the case of the device of the flat package type, its lead terminals have a small arrangement pitch of about 0.3 mm. When devices of the flat package type are to be tested, therefore, the second tester unit 20B is used instead of the first one 20A. As described above, positioning assemblies 130 are attached to the rear side of the second tester unit 20B.

As shown in FIG. 19, the first tester unit 20A is connected to the loader/unloader unit 10. It is therefore disconnected from the loader/unloader unit 10 to leave the unit 10 alone, as shown in FIGS. 5 and 18. Positioning assemblies 130 are then engaged with positioning assemblies 120 and joint angles 111 are fixed to a frame of the second tester unit 20B. The second tester unit 20B is thus connected to the loader/unloader unit 10, as shown in FIGS. 17 and 20.

Figure 17:
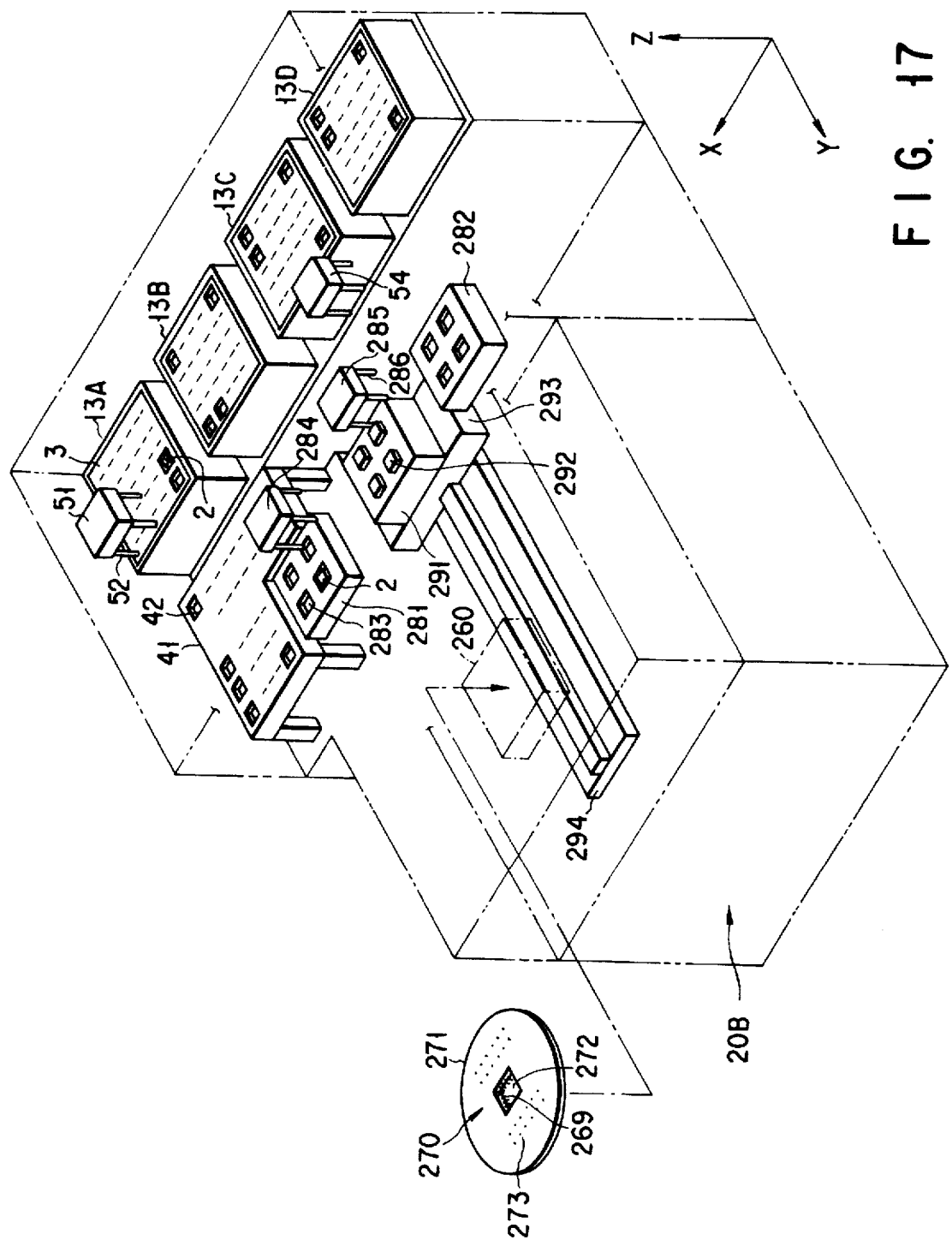
FIG. 17 is a perspective view showing the inside of the tester apparatus which is a combination of the loader/unloader unit and a second testing unit.

As shown in FIG. 17, the second tester unit 20B has a movable device-mounted stage 291 and unmovable alignment sections 281, 282. The device-supplying and -aligning section 281 is located adjacent to the pre-heating plate 41 and has recesses 283 in which devices 2 to be tested are temporarily placed. The device-mounted stage 291 can move on a rail 294 in the Y-axis direction. The Y-axis rail 294 extends from a test position in the second tester unit 20B to near the loader/unloader unit 10. The movable device-mounted stage 291 is arranged between the device-housing and -aligning section 282 and the device-supplying and -aligning section 281. The section 282 has recesses 283 in which devices 2 already tested are temporarily placed.

Four projections or convexes 292 are formed on the top of the movable stage 291. Devices 2 are placed, one upon each, on the projections 292. The movable stage 291 is mounted on a table moving along the axis X and it can thus move in the direction of the axis X, too.

The second tester unit 20B includes first and second carrier mechanisms 284 and 285. The first carrier mechanism 284 serves to carry devices 2, which are to be tested, from the section 281 to the movable stage 291. The second carrier mechanism 285 serves to carry devices 2, which have been tested, from the movable stage 291 to the section 282. As seen in the loader 51 and the unloader 54, each of these carrier mechanisms 284 and 285 has suction-holding sections 286 for suction-holding four devices 2 at the same time.

A probe card 270 is arranged on the top and in the center portion of the second tester unit 20B. It has a plurality of probes 269 along a center opening 272 in a card body 271. These probes 269 are attached to the card body 271 to contact lead terminals of the device 2. Each probe 269 is connected to a terminal 273 through a plated printed circuit. A test head 260 is arranged just above the probe card 270. A signal circuit of the test head 260 is electrically connected to terminals 273 through contact pins. The center opening 272 of the probe card 270 enables probes 269 and lead terminals to be viewed from above the probe card 270 through a microscope (not shown) or a television camera (not shown).

Four devices 2 are carried at the same time from the pre-heating plate 41 to the alignment section 281 by the loader 51. They are then carried from the alignment section 281 onto the stage 291 by the first carrier mechanism 284. The device-mounted stage 291 is moved to the test position, probes 269 are contacted with lead terminals of the device 2 and test signal is sent from the test head 260 to probes 269. One or plural devices 2 are tested at the same time. After the testing, the movable stage 291 is returned to its original position and devices 2 which have been tested are transferred onto the alignment section 282 by the second carrier mechanism 285. Devices 2 are then assorted on the basis of their test results and mounted on the tray 3 by the unloader 54.

According to the above-described tester apparatus, a loader/unloader unit is common to both of tester units which are replaced depending upon kinds of device used. Test room space can be thus made smaller and apparatus cost can be made lower. When lead terminals of a device have an arrangement pitch of 0.65 mm, for example, the first tester unit 20A is used and when lead terminals of another device have an arrangement pitch of 0.3 mm, the second tester unit 20B is used.

Further, the tester units used are not limited to the above-described ones but they may be of other types. In addition, the loader/unloader unit is not limited to the above-described one but it may be of such a type that includes no pre-heating plate.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A tester apparatus for carrying a large number of semiconductor devices to a test position, subsequently executing an electric test with respect to the semiconductor devices at the test position, and then carrying the semiconductor devices away from the test position, said tester apparatus comprising:

a loader/unloader unit including a loader section in which the semiconductor devices are housed before testing, and an unloader section in which the semiconductor devices are housed after testing;

a tester unit, detachably coupled to the loader/unloader unit, for supplying a test signal to the semiconductor devices when the semiconductor devices are at the test position, to thereby determine whether or not the semiconductor devices are defective;

a first aligning section, located between the tester unit and the loader/unloader unit, for aligning the semiconductor devices before testing;

a second aligning section, located between the tester unit and the loader/unloader unit, for aligning the semiconductor devices after testing;

first conveyance means for conveying the semiconductor devices from the loader section to the first aligning section before testing, and for conveying the semiconductor devices from the second aligning section to the unloader section after testing; and second conveyance means for conveying the semiconductor devices from the first aligning section to the test position before testing, and for conveying the semiconductor devices from the test position to the second aligning section after testing.

2. The tester apparatus according to claim 1, wherein the loader/unloader unit further comprises a joint assembly for connecting the tester unit to a rear side thereof.

3. The tester apparatus according to claim 2, wherein the joint assembly has an angle member provided with slots for enabling the tester unit to be adjusted in X axis and Y axis directions.

4. The tester apparatus according to claim 1, wherein the loader/unloader unit further comprises a first positioning assembly on a rear side thereof and the tester unit has a second positioning assembly on a rear side thereof, and wherein said second positioning assembly is engaged with the first positioning assembly.

5. The tester apparatus according to claim 2, wherein the loader/unloader unit further comprises a first positioning assembly on a rear side thereof and the tester unit has a second positioning assembly on rear side thereof, and wherein said second positioning assembly is engaged with the first positioning assembly.

6. The tester apparatus according to claim 5, wherein the first positioning assembly has plural convex members for enabling the tester unit to be adjusted in each of directions of Y axis and Z axis, the second positioning assembly has plural concave members for enabling the tester unit to be adjusted in the direction of the X axis, and when the convex members are engaged with the concave members, the tester unit can be positioned relative to the loader/unloader unit in each of directions of X axis, Y axis and Z axis.

7. The tester apparatus according to claim 6, wherein the joint assembly includes an angle member provided with slots for enabling the tester unit to be adjusted in each of X axis and Y axis directions and said angle member is arranged between a pair of convex members.

8. The tester apparatus according to claim 6, wherein a pair of said convex members are provided, wherein each of said pair of convex members are attached to the rear side of the loader/unloader unit, and a pair of said concave members are provided, and wherein each of said pair of concave members are attached to the rear side of the tester unit.

9. A tester apparatus for carrying a plurality of semiconductor devices, each having lead terminals, to a test position, subsequently executing an electric test with respect to the semiconductor devices at the test position, and then carrying the semiconductor devices away from the test position, said tester apparatus comprising:

a loader/unloader unit including a loader section in which the semiconductor devices are housed before testing, and an unloader section in which the semiconductor devices are housed after testing;

a first tester unit, detachably coupled to the loader/unloader unit, for supplying a test signal to the semiconductor devices when the semiconductor devices are at the test position, to thereby determine whether or not the semiconductor devices are defective;

a second tester unit, detachably coupled to the loader/ unloader unit and used in place of the first tester unit, for supplying a test signal to the semiconductor devices when the semiconductor devices are at the test position, to thereby determine whether or not the semiconductor devices are defective;

a first aligning section, located between the loader/ unloader unit and one of the first and second tester units, for aligning the semiconductor devices before testing;

a second aligning section, located between the loader/ unloader unit and one of the first and second tester units, for aligning the semiconductor devices after testing;

first conveyance means for conveying the semiconductor devices from the loader section to the first aligning section before testing, and for conveying the semiconductor devices from the second aligning section to the unloader section after testing; and second conveyance means for conveying the semiconductor devices from the first aligning section to the test position before testing, and for conveying the semiconductor devices from the test position to the second aligning section after testing, wherein said first tester unit includes a first test section provided with a socket section with which the lead terminals of each of the semiconductor devices are brought into contact, and first carrier means for holding the semiconductor devices at the first aligning section and carrying the devices to the socket section, and for holding the semiconductor devices at the socket section and carrying the devices from the socket section to the second aligning section, and wherein said second tester unit includes a second test section which is provided with a device-mounted stage which is movable between a device mount position and the test position and which electrically tests the semiconductor devices, with probes kept in contact with the lead terminals of the devices, and second carrier means for holding the semiconductor devices at the first aligning section and carrying the devices to the device-mounted stage, and for holding the semiconductor devices at the device-mounted stage and carrying the devices from the device-mounted stage to the second aligning section.

10. The tester apparatus according to claim 9, further comprising moving means for moving the first aligning and second aligning sections along the X axis.

11. The tester apparatus according to claim 9, wherein said second conveyance means has mechanisms for moving in each of X axis, Y axis and Z axis directions.

12. The tester apparatus according to claim 9, wherein loader and unloader sections are arranged along the X axis.

13. The tester apparatus according to claim 9, wherein said socket section is located remote from the loader section and unloader section.

14. The tester apparatus according to claim 1, wherein said semiconductor devices are housed in each of the first and second aligning sections, with their major surfaces substantially in one plane.

15. The tester apparatus according to claim 9, wherein said semiconductor devices are housed in each of the first and second aligning sections, with their major surfaces substantially in one plane.

* * * * *